(12) United States Patent
Curatola et al.

(10) Patent No.: US 8,674,372 B2
(45) Date of Patent: Mar. 18, 2014

(54) HEMT WITH INTEGRATED LOW FORWARD BIAS DIODE

(75) Inventors: Gilberto Curatola, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 87 days.

(21) Appl. No.: 13/213,351

(22) Filed: Aug. 19, 2011

(65) Prior Publication Data

US 2013/0043484 A1 Feb. 21, 2013

(51) Int. Cl.
*H01L 29/15* (2006.01)
*H01L 21/338* (2006.01)

(52) U.S. Cl.
USPC .............................. 257/76; 257/194; 438/167

(58) Field of Classification Search
USPC ............ 257/76, 194, 195, E21.403, E27.016, 257/E29.246, E29.253, E21.407; 438/167, 438/172
See application file for complete search history.

(56) References Cited

U.S. PATENT DOCUMENTS

| | | | | |
|---|---|---|---|---|
| 2009/0065810 | A1* | 3/2009 | Honea et al. .................. | 257/192 |
| 2009/0072269 | A1* | 3/2009 | Suh et al. ...................... | 257/136 |
| 2010/0201439 | A1* | 8/2010 | Wu et al. ....................... | 327/581 |
| 2010/0207164 | A1 | 8/2010 | Shibata et al. | |

FOREIGN PATENT DOCUMENTS

JP 2001308108 A 11/2001

* cited by examiner

*Primary Examiner* — Selim Ahmed
(74) *Attorney, Agent, or Firm* — Murphy, Bilak & Homiller, PLLC (57) ABSTRACT

A high electron mobility transistor includes a source, gate and drain, a first III-V semiconductor region having a two-dimensional electron gas (2DEG) which provides a first conductive channel controllable by the gate between the source and drain, and a second III-V semiconductor region below the first III-V semiconductor region and having a second conductive channel connected to the source or drain and not controllable by the gate. The first and second III-V semiconductor regions are spaced apart from one another by a region of the high electron mobility transistor having a different band gap than the first and second III-V semiconductor regions.

29 Claims, 5 Drawing Sheets

HEMT WITH INTEGRATED LOW FORWARD BIAS DIODE

TECHNICAL FIELD

The present application relates to high electron mobility transistors, in particular high electron mobility transistors with integrated low forward bias diodes.

BACKGROUND

Conventional high electron mobility transistors (HEMTs) fabricated in GaN/AlGaN technology are typically majority carrier devices, i.e. only one type of carriers (electrons or holes) are mainly involved in determining the electrical properties of the device. This feature is particularly beneficial for III-V diodes when compared to classical Silicon body diodes. With Silicon body diodes, the main electrical properties are controlled via the doping and device dimensions, and both the minority and majority carriers affect device operation. In particular, during switching operations conventional silicon devices experience a so-called "reverse recovery time" which represents a time delay needed to remove the stored charges during the device conduction before the device can enter blocking mode operation. This reverse recovery time delay is particularly detrimental because it highly increases switching losses. For this particular reason, Schottky diodes and in general majority carrier devices, are preferred in applications where higher losses due to diode reverse recovery time cannot be tolerated.

GaN/AlGaN technology represents a large step forward in power electronics due to higher performance in terms of current drive capability, breakdown strength, and switching frequency to name a few, when compared to conventional silicon technology. One key feature of conventional present-day GaN/AlGaN technology, which is a disadvantage for forming integrated diodes, is the difficulty in accurately controlling and activating doping in the device. Indeed, the main electrical properties of a typical GaN/AlGaN device are controlled via polarization charges which allow the device performance to be tailored without the use of doping. The difficulty in controlling doping in III-V materials (especially p-type doping) represents a major drawback in designing high-blocking mode and low forward bias diodes.

With a typical GaN/AlGaN HEMT there is no real body diode, as is conventionally present in a typical silicon device. However, when the HEMT device is in an off-state condition, i.e. in the absence of an electron channel below the gate electrode, a pseudo-body diode can be observed which connects the source terminal to the drain terminal. An electron in the channel of the pseudo-body diode must overcome an energy barrier having a certain height in order to traverse from the source to drain electrode. Different from conventional silicon technology, in GaN technology this barrier height is not fixed via the doping profile but by the material properties (energy gap) and also by the voltage applied to the gate electrode. The stronger the device is biased in pinch-off, the higher the forward bias of the pseudo-body diode.

When a negative voltage is applied to the drain electrode, with the device being in off-state conditions, the conduction band on the drain side is pulled up and therefore the effective barrier height that carriers must overcome to reach the source electrode is lowered. When a certain threshold voltage is reached, the pseudo-body diode opens and allows current flow between the source and drain electrodes. However, typical forward bias voltages for such a pseudo-body diode in GaN technology is in the order of 3V and increases (becomes more negative) when the device is biased more strongly in off-state conditions. This particular characteristic of the pseudo-body diode negatively impacts the switching behavior of the power transistor in all applications where a low forward bias body diode is needed. In some conventional approaches, a lateral Schottky diode with a low forward bias is integrated with the HEMT. This approach however results in an area penalty due to integration of a series lateral device. Also, the pre-existing GaN baseline process must be modified to include a low forward bias Schottky diode which increases cost. Furthermore, the Schottky diode can become unstable due to surface effects.

SUMMARY

According to the embodiments described herein, a high electron mobility transistor (HEMT) is provided with an integrated diode having a low forward bias, stable threshold voltage and high current drive capability.

According to an embodiment of an HEMT, the HEMT includes a source, gate and drain, a first III-V semiconductor region having a two-dimensional electron gas (2DEG) which provides a first conductive channel controllable by the gate between the source and drain, and a second III-V semiconductor region below the first III-V semiconductor region and having a second conductive channel connected to the source or drain and not controllable by the gate. The first and second III-V semiconductor regions are spaced apart from one another by a region of the high electron mobility transistor having a different band gap than the first and second III-V semiconductor regions.

According to another embodiment of an HEMT, the HEMT includes a diode, a 2DEG providing a first conductive channel disposed in a III-V semiconductor region, the first 2DEG and the drain forming a cathode of the diode, and a second conductive channel below the first conductive channel, the second conductive channel and the source forming an anode of the diode. The diode has a low enough energy barrier in an off-state of the high electron mobility transistor so that the diode has a forward bias voltage of less than 1V in the off-state.

According to yet another embodiment of an HEMT, the HEMT includes a source, gate and drain, a first GaN region having a 2DEG which provides a first conductive channel controllable by the gate between the source and drain, a second GaN region below the first GaN region and having a second conductive channel, and a plurality of AlGaN layers interposed between the first and second GaN layers so that the first and second conductive channels are spaced apart from one another by the plurality of AlGaN layers.

According to an embodiment of a method of manufacturing an HEMT having a source, drain and gate, the method includes: providing a first III-V semiconductor region having a 2DEG which provides a first conductive channel controllable by the gate between the source and the drain; providing a second III-V semiconductor region below the first III-V semiconductor region and having a second conductive channel connected to the source or drain and not controllable by the gate; and providing a region of the high electron mobility transistor interposed between the first and second III-V semiconductor regions with a different band gap than the first and second III-V semiconductor regions.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate cor

DETAILED DESCRIPTION

Figure 1:
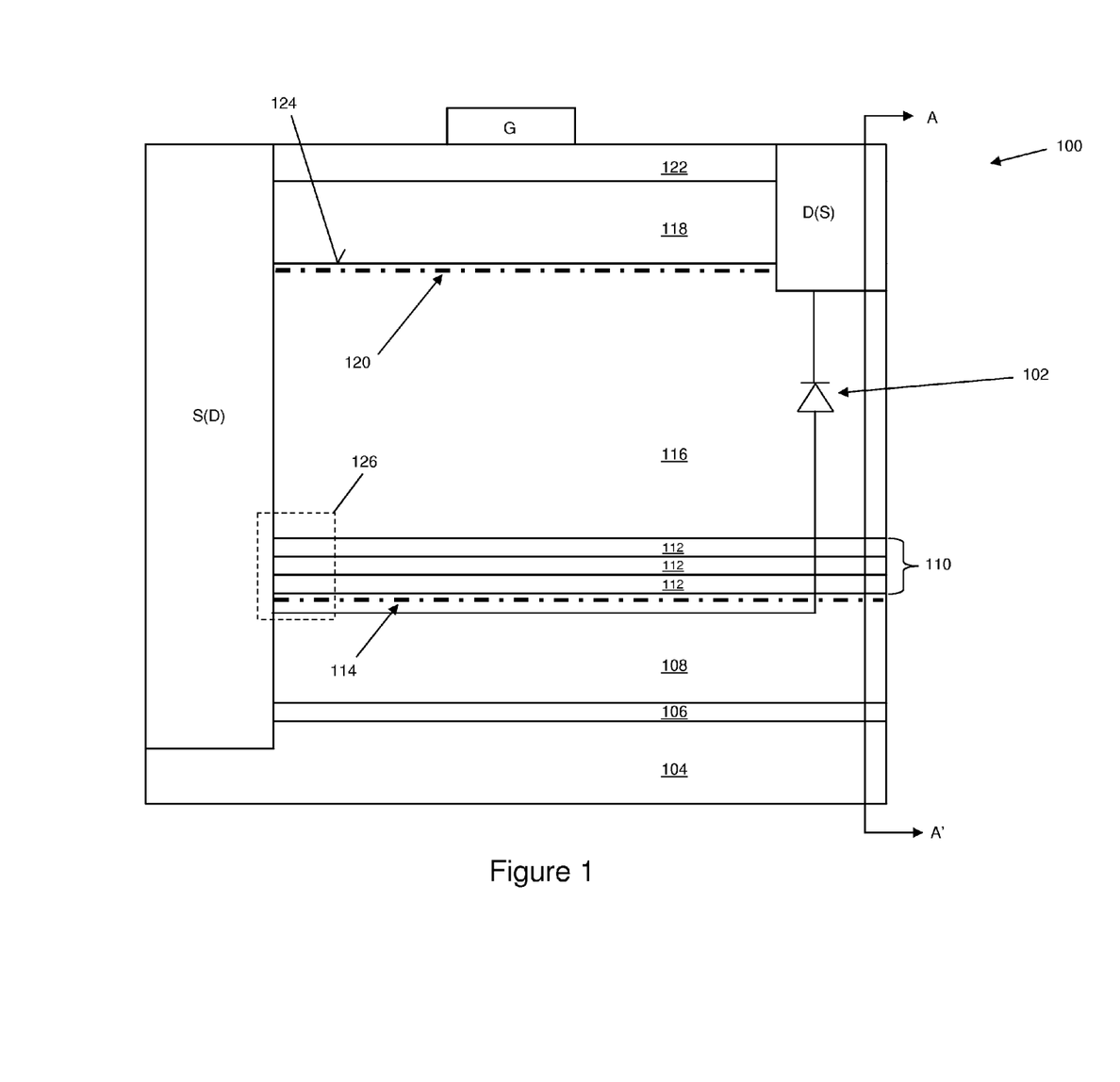
- FIG. 1 illustrates a cross-sectional perspective view of an embodiment of an HEMT with an integrated low forward bias diode.

FIG. 1 illustrates an embodiment of a high electron mobility transistor (HEMT) 100 with an integrated diode 102 having a low forward bias, stable threshold voltage and high current drive capability. The diode 102 is schematically illustrated in FIG. 1. The HEMT 100 is well-suited for lower voltage applications e.g. in the range of about 30 to 100V. The HEMT 100 includes a semiconductor substrate 104 such as a Si, SiC or sapphire wafer, and depending on the type of substrate employed, may include an optional isolation layer 106 such as an AlN layer formed on the substrate 104. A lower III-V semiconductor buffer region 108 such as a GaN layer is formed on the optional isolation layer 106 or directly on the substrate 104. A compensation structure 110 is formed on the lower III-V semiconductor buffer region 108 and an upper III-V semiconductor buffer region 116 such as a GaN layer is formed on the compensation structure 110 so that the compensation structure 110 is interposed between the upper and lower III-V semiconductor buffer regions 116, 108.

The compensation structure 110 has a different band gap (e.g. a higher band gap) than the upper and lower III-V semiconductor buffer regions 116, 108. According to an embodiment, the compensation structure 110 includes at least one layer 112 containing Al formed on the lower III-V semiconductor buffer region 108. The Al content of the lowermost layer 112 of the compensation structure 110 can be selected so that a two-dimensional electron gas (2DEG) 114 arises in the lower III-V semiconductor buffer region 108. The 2DEG 114 automatically results in a thin conductive channel (inversion layer) in the lower III-V semiconductor buffer region 108. Alternatively, an upper layer of the lower III-V semiconductor buffer region 108 or the lowermost layer 112 of the compensation structure 110 may be doped n+ e.g. with a doping concentration of at least $1 \times 10^{18}$ cm-3 in order to form the channel in the lower III-V semiconductor buffer region 108. In either case (via strain and polarization effects or doping), the lower III-V semiconductor buffer region 108 has a conductive channel.

The compensation structure 110 is interposed between the upper and lower III-V semiconductor buffer regions 116, 108 as shown in FIG. 1. A barrier layer 118 e.g. which contains Al such as an AlGaN layer is formed on the upper III-V semiconductor buffer region 116. The Al content of the barrier layer 118 is high enough so that a 2DEG 120 arises in the upper III-V semiconductor buffer region 116 via strain and polarization effects. The 2DEG 120 automatically results in a thin conductive channel in the upper III-V semiconductor buffer region 116. This way, the HEMT 100 has an upper 2DEG 120 and corresponding upper channel and a lower channel (and possibly a corresponding lower 2DEG 114 depending on whether strain and polarization effects or doping is employed to form the lower channel as described above) which are spaced apart from one another by the compensation structure 110. A cap layer 122 such as a GaN layer is formed on the barrier layer 118, and a gate (G) is formed above the cap layer 122 for controlling a channel (inversion layer) of the HEMT 100.

The upper channel which results from the upper 2DEG 120 connects the source (S) and drain (D) of the HEMT 100 and forms the main channel of the device. The gate controls whether the upper channel is continuous (conducting channel) so that the HEMT 100 can be operated in an on-state, or pinched off (non-conducting channel) so that the HEMT 100 can be operated in an off-state via the gate voltage. A positive threshold voltage HEMT is commonly referred to as a 'normally-off' HEMT. However, the HEMT 100 may instead be a 'normally-on' device in that the transistor has a negative threshold voltage. The integrated diode 102 is not dependent on the particular transistor configuration, i.e. normally-on or normally-off. Instead, the diode 102 can be integrated into either type of HEMT device without additional changes. With this understanding, the HEMT 100 is placed in the on-state by applying a voltage to the gate which is above the threshold voltage. In the on-state, current flows from the source (S) to drain (D) via the upper channel. The HEMT 100 is placed in the off-state by applying a voltage to the gate which is below the threshold voltage. In the off-state the upper channel is pinched off so that no (or minimal) current flows from the source to drain. Prior to enter a blocking mode of the off-state, it may be desirable for the HEMT 100 to enter a reverse off-state mode by applying a negative voltage to the drain in order to remove excess charge carriers. In the reverse off-state mode, the HEMT 100 is still in the off-state with the upper channel pinched off. Also, the integrated diode 102 is forward biased and permits current to flow from the source, through the lower channel and compensation structure 110, then through the upper III-V semiconductor buffer region 116 and is finally collected at the drain.

During normal device operation, the diode 102 does not influence the behavior of the HEMT 100 and, in both on-state (e.g. positive gate voltage, positive drain voltage for a normally-on device) and off-state (e.g. negative gate voltage, positive drain voltage for a normally-on device) conditions, the current flows laterally, parallel to the barrier/upper buffer interface 124. When a negative voltage is applied to the drain in the off-state, the HEMT 100 enters the reverse off-state mode and the diode 102 is forward biased at a low voltage. That is, the diode 102 is forward biased when the drain voltage is lower than the source voltage by the forward voltage drop.

The source and drain of the HEMT 100 extend through the cap layer 122 and barrier layer 118 into the upper III-V semiconductor buffer region 116 and are connected by the upper channel in the on-state. Either the source or drain extends further to the lower channel (e.g. to the lower 2DEG 114 in FIG. 1) in order to form an electrical connection to the integrated diode 120. FIG. 1 shows the source extending to the lower 2DEG 114. In an alternative embodiment the drain and not source extends deeper to the lower 2DEG 114 as indicated in parenthesis. As described above, only the lower channel and not the lower 2DEG 114 may be present in the lower part of the HEMT 100 if doping is employed to form the lower channel instead of strain and polarization effects. In either case, the lower channel forms in about the same region as the lower 2DEG 114 and therefore a separate reference number for the lower channel is not show in FIG. 1 just as a separate reference number is not shown for the upper channel which forms along the upper 2DEG 120.

In each case, the integrated diode 102 has a cathode formed by the upper 2DEG 120 and drain and an anode formed by the lower channel and source. The upper 2DEG 120 and channel of the HEMT 100 are not affected by the presence of the diode 102. In addition, the diode 102 has a low enough energy barrier in the off-state of the HEMT 100 so that the diode 102 forward biases at 1V or less (with reference to a negative drain voltage) to enter the reverse off-state mode in which the channel of the HEMT 100 remains pinched off (non-conducting) and the diode 102 and lower channel (and also the lower 2DEG 114 in some embodiments) conduct current in the reverse direction (from drain to source). In one embodiment, the diode 102 has a low enough energy barrier in the off-state so that the diode 102 has a forward bias voltage of less than 0.8V, or even less than 0.6V. In some embodiments, the forward bias voltage of the diode 102 is between 0.1 and 0.6 V. Such a low forward bias diode 102 is realized by incorporating the compensation structure 110 into the HEMT 100 between the upper 2DEG 120 and the lower channel. (and also the lower 2DEG 114 in some embodiments).

In one embodiment, the compensation structure 110 contains a sufficient amount of Al to form the lower 2DEG 114 (and lower channel) as described above. The polarization charges and different energy gaps made available by the Al-containing compensation structure 110 yield a distinctive conduction band profile so that the compensation structure 110 has a relatively flat energy barrier height region in which the electric field is close to zero. The upper and lower channels are separated by this relatively flat energy barrier height region of the compensation structure 110. The junction between the upper channel and the upper III-V semiconductor buffer region 116 has a much higher energy barrier height in the HEMT off-state as compared to the diode 102. The barrier height of the diode 102 results in a lower forward bias. In one embodiment, the barrier height is <1 eV e.g. 0.6 to 0.8 eV in order to implement a diode 102 with a low forward bias of <1 V.

A low barrier height e.g. of <1 eV in this lower region of the HEMT 100 can be realized by selecting the Al content of the compensation structure 110 so that the electric field and barrier height of the lower conducting region are shaped as desired. Once carriers (electrons) cross this barrier, they are free to flow from the drain to the source via the lower channel (and the lower 2DEG 114 if provided). As shown in FIG. 1, the compensation structure 110 can include a plurality of layers 112, one or more of which contain Al. Providing a compensation structure 110 that contains Al not only results in the formation of the lower 2DEG 114 via polarization charges, but also fixes the barrier height of the diode 102 and distance between the two carrier reservoirs (i.e. the two 2DEGs). However, the diode 102 can have an undesirable ambipolar behavior (i.e. the diode can conduct current in both directions) if there is not sufficient separation between the upper and lower 2DEGs 120, 114. Inserting the compensation structure 110 in the HEMT 100 fixes the barrier height of the diode 102 to a value suitable for having a low forward bias. Moreover, the barrier height of the diode 102 does not increase with increasing the distance between the upper and lower channels, as would be the case for a non-compensating electric field. On the contrary, the presence of the compensation structure 110 provides a relatively flat central region where the conduction band profile is generally flat as described above.

The compensation structure 110 can be made thick enough to avoid the diode ambipolar behavior. The diode 102 is designed to have a low barrier height (and thus low forward bias) as described above, and a sufficient separation is provided between the upper and lower channels via the compensation structure 110 so that the diode 102 can conduct current in one direction but not in the reverse direction. By providing compensation layers of appropriate thickness and Al content in the compensation structure 110, a central region with zero electric field is provided in the HEMT 100 as described above. Such a structure provides sufficient separation between the upper and lower channels without adversely increasing the forward bias voltage of the diode 102.

In one embodiment, the upper and lower channels are spaced at least 300 nm apart and the diode 102 has a forward bias voltage of 1V or less. The upper and channels can be spaced at least 500 nm apart, or spaced between 500 nm apart and 1 µm apart or further and the diode 102 still has a forward bias voltage of about 1V or less by appropriately selecting the layer thickness and band gap of the compensation structure 110. In general, the compensation structure 110 decouples the barrier height of the diode 102 from the distance between the upper and lower channels.

Figure 2:
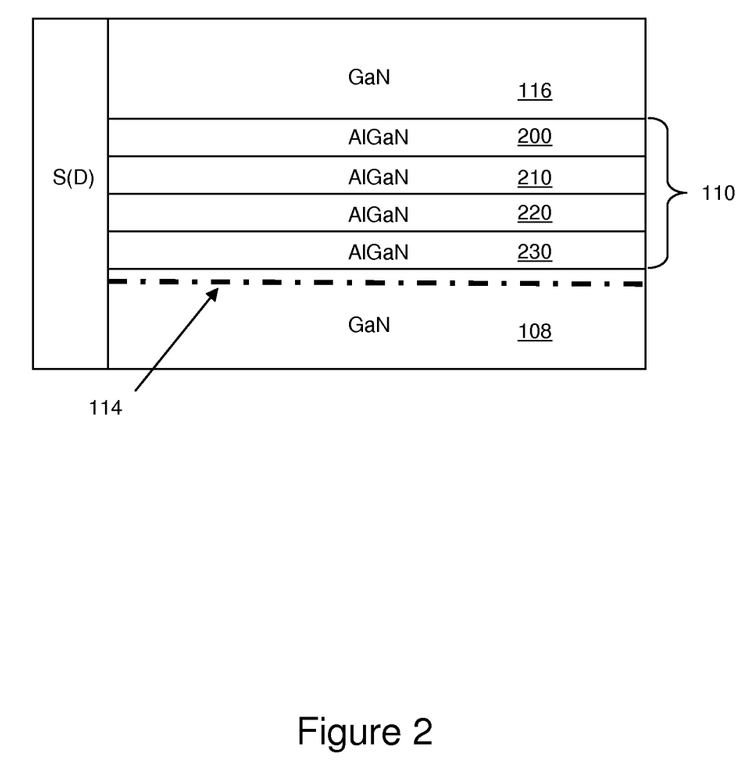
FIG. 2 illustrates a cross-sectional perspective view of an embodiment of a compensation structure included in the HEMT of FIG. 1.

FIG. 2 illustrates an exploded view of an embodiment of the compensation structure 110, in a dashed region 126 of FIG. 1. According to this embodiment, the compensation structure 110 includes four AlGaN layers 200, 210, 220, 230 interposed between upper and lower GaN buffer regions 116, 108. The upper and lower GaN buffer regions 116, 108 each have a 2DEG as explained previously herein. Only the lower 2DEG 114 is visible in FIG. 2.

The layers 200, 210, 220, 230 of the compensation structure 110 can have the same or different Al content. In one embodiment, the uppermost layer 200 of the compensation structure 110 has the most Al content e.g. about 4%, the layer 210 immediately below the uppermost layer 200 has e.g. about 1% Al and the next lowest layer 220 has e.g. about 2% Al content. The lowest layer 230 of the compensation structure 110 can include a sufficient amount of Al to form the lower 2DEG 114 in the lower GaN buffer region 108 via polarization effects.

Figure 3:
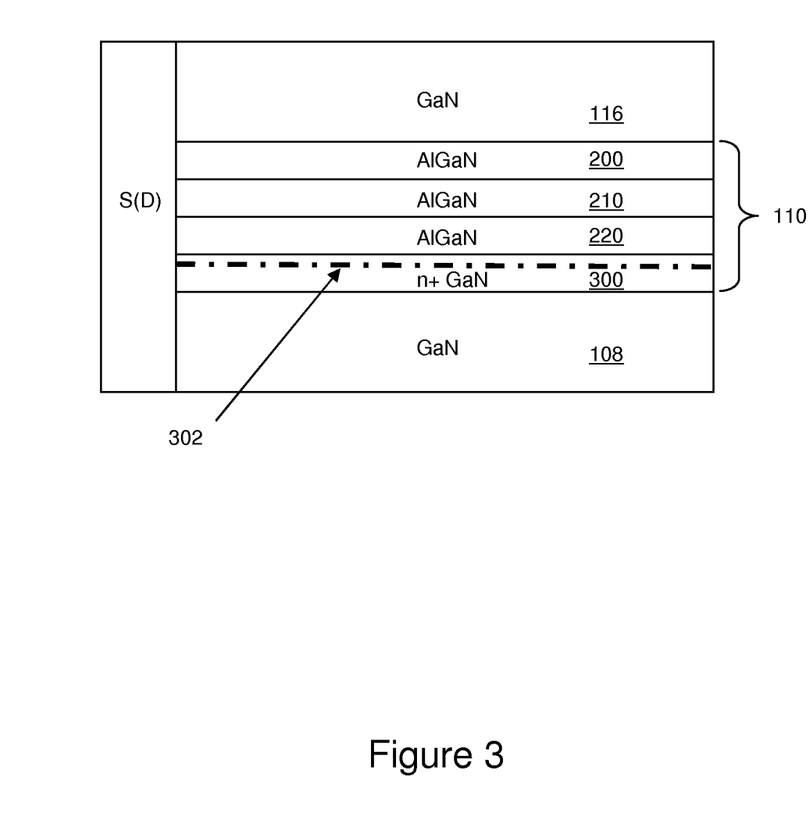
FIG. 3 illustrates a cross-sectional perspective view of another embodiment of the compensation structure included in the HEMT of FIG. 1.

FIG. 3 shows an alternative embodiment of the compensation structure 110. The structure 110 shown in FIG. 3 is similar to the one shown in FIG. 2, however the lowermost layer 300 of the compensation structure 110 contains no appreciable Al and instead is heavily n+ doped e.g. with a concentration of at least $1 \times 10^{18}$ cm-3. As such, the Al containing layers 200, 210, 220 of the compensation structure 110 are interposed between the upper GaN buffer region 116 and the lowermost doped (non-aluminium containing) layer 300 of the compensation structure 110. The doping of the lowermost layer 300 is sufficient to form the conductive channel 302 in the lowermost layer 300 of the compensation structure 110 without having to employ a 2DEG in this lower part of the HEMT 100.

In each case, upper and lower channels are provided and the thickness and band gap of the compensation structure 110 ensures the integrated 102 has a low forward bias, stable threshold voltage and high current drive capability in the HEMT off-state. Also in each case, the layers of the compensation structure 110 can have the same or different thickness. In one embodiment, the layers of the compensation structure 110 have approximately the same thickness e.g. about 10 to 20 nm.

Figure 4:
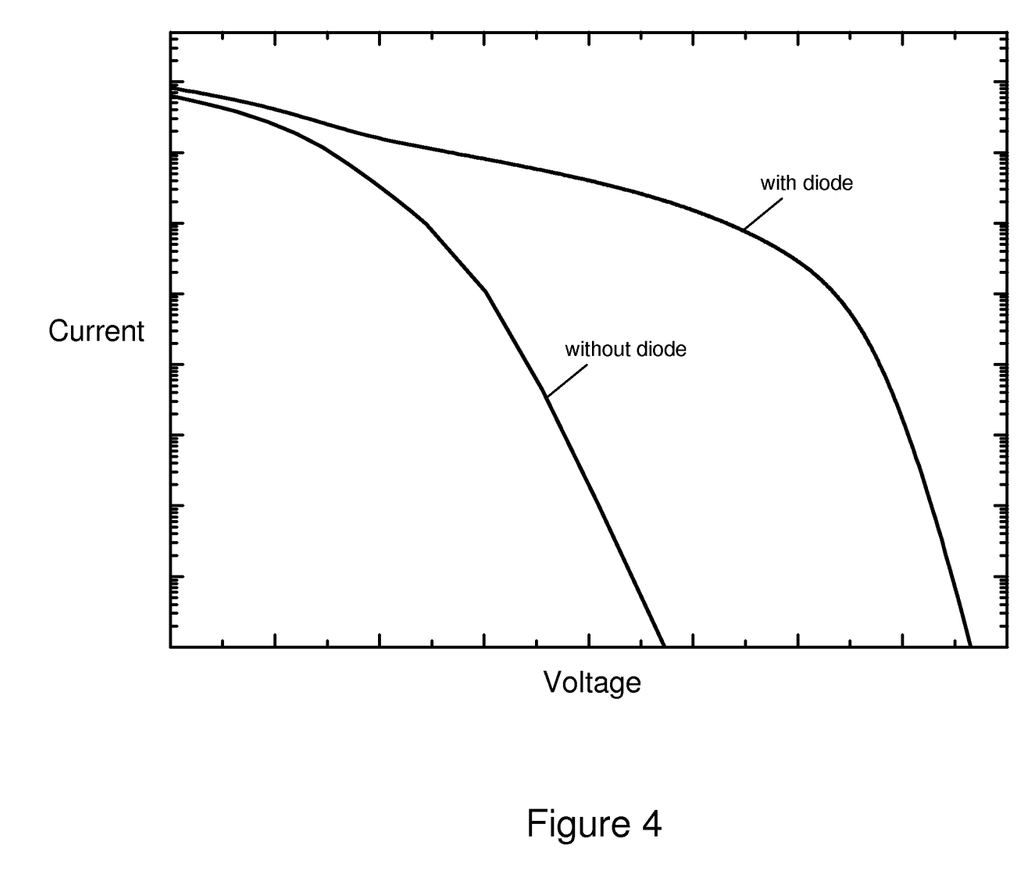
FIG. 4 illustrates a graphical representation of the I-V characteristics of the integrated diode of FIG. 1 and a pseudo diode included in a conventional HEMT.

FIG. 4 illustrates a comparison of the electrical characteristics of a GaN HEMT in off-state conditions, when a negative voltage is applied to the drain electrode. The graph plots voltage (x-axis) versus current (y-axis). Both a conventional GaN HEMT (represented by the curve labeled "with diode") and the HEMT 100 described herein with an integrated diode 102 (represented by the curve labeled "without diode") are compared. In both cases the transistor is biased in off-state conditions, i.e. the main channel is depleted below the gate electrode in order to avoid direct current flow from the source to drain via the channel. A negative voltage is then applied to the drain and when this voltage is sufficiently negative, the diode 102 opens and current can flow. Of course the opposite gate and drain voltage polarities are used for normally-on devices. In a conventional GaN HEMT, the pseudo diode described in the background section opens at around 3V while the integrated diode 102 described herein has a significantly lower forward bias of 1 V or less, e.g. in the order of 0.1 to 0.6 V (with reference to a negative drain voltage).

Figure 5:
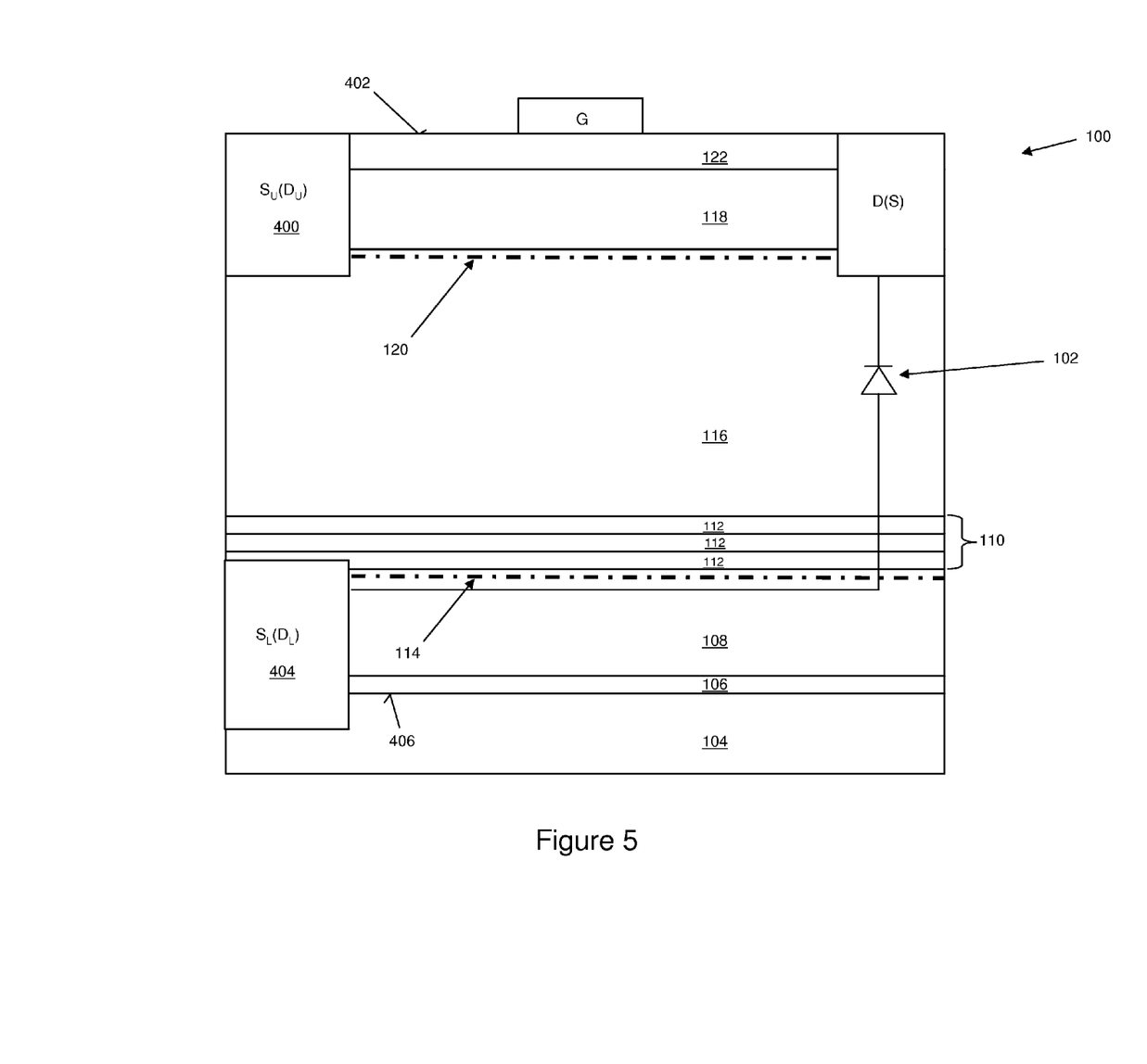
FIG. 5 illustrates a cross-sectional perspective view of another embodiment of an HEMT with an integrated low forward bias diode.

FIG. 5 illustrates another embodiment of the HEMT 100. The embodiment shown in FIG. 5 is similar to the one shown in FIG. 1. Differently however the source (or drain) includes an upper region 400 which extends from a top side 402 of the device into the upper III-V semiconductor buffer region 116 and a lower region 404 which extends from an opposing bottom side 406 of the device into the lower III-V semiconductor buffer region 108. The upper source (or drain) region 400 is in electrical contact with the upper 2DEG 120 and the lower second source (or drain) region 404 is in electrical contact with the lower channel (and lower 2DEG 114 if present). The upper and lower regions 400, 404 of the source (or drain) are spaced apart from one another by the compensation structure 110. This way, the source (or drain) can be contacted from both the top side 402 and bottom side 406. In the on-state, current flows from the upper source region 400 through the channel to the drain via the upper channel and 2DEG 120. In the reverse off-state mode, the upper channel is pinched off and current flows from the lower source region 404 to the drain via the lower channel (and lower 2DEG 114 is present) and the forward biased diode 102.

The integrated diode 102 described herein utilizes two different channels separated by a barrier height that can be tailored depending on the desired diode forward bias point. The integrated diode 102 described herein can make use of polarization charges to realize upper and lower 2DEG regions 120, 114 (or at least the upper 2DEG 120 where the lower 2DEG 114 alternatively can be realized by doping as described herein e.g. with reference to FIG. 3). Providing a stack of AlGaN layers as the compensation structure 110 fixes the barrier height of the diode 102 to a desired value. With a sufficient thickness and band gap, the compensation structure 110 in general suppresses the ambipolar diode behavior while decoupling the diode barrier height from the distance between the upper and lower channels.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A high electron mobility transistor, comprising:
a source, gate and drain;
a first III-V semiconductor region having a two-dimensional electron gas (2DEG) which provides a first conductive channel controllable by the gate between the source and drain;
a second III-V semiconductor region below the first III-V semiconductor region and having a second conductive channel connected to the source or drain and not controllable by the gate; and
wherein the first and second III-V semiconductor regions are spaced apart from one another by a region of the high electron mobility transistor having a different band gap than the first and second III-V semiconductor regions.

2. The high electron mobility transistor according to claim 1, wherein the first and second conductive channels are spaced at least 300 nm apart.

3. The high electron mobility transistor according to claim 2, wherein the first and second conductive channels are spaced at least 500 nm apart.

4. The high electron mobility transistor according to claim 3, wherein the first and second conductive channels are spaced between 500 nm apart and 1 μm apart.

5. The high electron mobility transistor according to claim 1, wherein the first conductive channel is operable to connect the source and drain when the high electron mobility transistor is in an on-state, and the second conductive channel is operable to connect the source and drain in reverse bias when the high electron mobility transistor is in an off-state.

6. The high electron mobility transistor according to claim 1, wherein the source or the drain extends from the 2DEG to the second conductive channel.

7. The high electron mobility transistor according to claim 6, wherein the source or the drain comprises a first region which extends into the first III-V semiconductor region and is in electrical contact with the 2DEG and a second region which extends into the second III-V semiconductor region and is in electrical contact with the second conductive channel, the first and second regions of the source or drain being spaced apart from one another by the region of the high electron mobility transistor having the different band gap.

8. The high electron mobility transistor according to claim 1, wherein the region of the high electron mobility transistor having the different band gap comprises a plurality of layers containing Al interposed between the first and second III-V semiconductor regions so that the first and second conductive channels are spaced apart from one another by the plurality of layers.

9. The high electron mobility transistor according to claim 8, wherein the plurality of layers have different Al content.

10. The high electron mobility transistor according to claim 8, wherein one of the plurality of layers is adjacent the first III-V semiconductor region and has a higher Al content than the other layers.

11. The high electron mobility transistor according to claim 8, wherein each layer of the plurality of layers is at least 10 nm thick.

12. The high electron mobility transistor according to claim 8, wherein one or more of the plurality of layers contains between 4% and 1% Al.

13. The high electron mobility transistor according to claim 8, further comprising an additional layer disposed below the plurality of layers so that the plurality of layers is interposed between the first III-V semiconductor region and the additional layer, wherein the additional layer forms the second III-V semiconductor region and is doped high enough to generate the second conductive channel.

14. The high electron mobility transistor according to claim 8, wherein one of the plurality of layers is adjacent the second III-V semiconductor region and contains enough Al to cause a 2DEG to form in the second III-V semiconductor region.

15. A high electron mobility transistor, comprising:
a diode;
a two-dimensional electron gas (2DEG) providing a first conductive channel disposed in a III-V semiconductor region, the 2DEG and a drain of the transistor forming a cathode of the diode; and
a second conductive channel below the first conductive channel, the second conductive channel and a source of the transistor forming an anode of the diode, the diode having a low enough energy barrier in an off-state of the high electron mobility transistor so that the diode has a forward bias voltage of less than 1V in the off-state.

16. The high electron mobility transistor according to claim 15, wherein the diode has a forward bias voltage less than 0.8V in the off-state.

17. The high electron mobility transistor according to claim 16, wherein the diode has a forward bias voltage between 0.1 V and 0.6V in the off-state.

18. The high electron mobility transistor according to claim 16, wherein the diode has an energy barrier less than 1 eV in the off-state.

19. The high electron mobility transistor according to claim 18, wherein the energy barrier of the diode is less than 0.8 eV in the off-state.

20. The high electron mobility transistor according to claim 15, wherein the second conductive channel comprises a doped region spaced apart from the first conductive channel.

21. The high electron mobility transistor according to claim 15, wherein the second conductive channel is formed from an additional 2DEG spaced apart from the 2DEG disposed in the III-V semiconductor region.

22. A high electron mobility transistor, comprising:
a source, gate and drain;
a first GaN region having a two-dimensional electron gas (2DEG) which provides a first conductive channel controllable by the gate between the source and drain;
a second GaN region below the first GaN region and having a second conductive channel; and
a plurality of AlGaN layers interposed between the first and second GaN layers so that the first and second conductive channels are spaced apart from one another by the plurality of AlGaN layers.

23. The high electron mobility transistor according to claim 22, wherein the plurality of AlGaN layers have different Al content.

24. The high electron mobility transistor according to claim 22, wherein one of the plurality of AlGaN layers is adjacent the first GaN region and has a higher Al content than the other AlGaN layers.

25. The high electron mobility transistor according to claim 22, wherein each layer of the plurality of AlGaN layers is at least 10 nm thick.

26. The high electron mobility transistor according to claim 22, wherein one or more of the plurality of AlGaN layers contains between 4% and 1% Al.

27. The high electron mobility transistor according to claim 22, further comprising an additional layer disposed below the plurality of AlGaN layers so that the plurality of AlGaN layers is interposed between the first GaN region and the additional layer, wherein the additional layer is the second GaN region and is doped high enough to form the second conductive channel.

28. The high electron mobility transistor according to claim 22, wherein one of the plurality of AlGaN layers is adjacent the second GaN region and contains enough Al to cause a 2DEG to form in the second GaN region.

29. A method of manufacturing a high electron mobility transistor having a source, drain and gate, comprising:
providing a first III-V semiconductor region having a two-dimensional electron gas (2DEG) which provides a first conductive channel controllable by the gate between the source and the drain;
providing a second III-V semiconductor region below the first III-V semiconductor region and having a second conductive channel connected to the source or drain and not controllable by the gate; and
providing a region of the high electron mobility transistor interposed between the first and second III-V semiconductor regions with a different band gap than the first and second III-V semiconductor regions.

* * * * *